US008203898B2

(12) United States Patent
Campbell et al.

(10) Patent No.: US 8,203,898 B2
(45) Date of Patent: Jun. 19, 2012

(54) LEAKAGE AND NBTI REDUCTION TECHNIQUE FOR MEMORY

(75) Inventors: Brian J. Campbell, Cupertino, CA (US); Greg M. Hess, Mountain View, CA (US); Hang Huang, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/171,748

(22) Filed: Jun. 29, 2011

(65) Prior Publication Data

US 2011/0255355 A1    Oct. 20, 2011

Related U.S. Application Data

(62) Division of application No. 12/492,364, filed on Jun. 26, 2009, now Pat. No. 7,995,410.

(51) Int. Cl.
*G11C 7/00* (2006.01)

(52) U.S. Cl. .................. 365/203; 365/194; 365/230.03; 365/233.1

(58) Field of Classification Search .................. 365/194, 365/203, 230.03, 233.1
See application file for complete search history.

(56) References Cited

U.S. PATENT DOCUMENTS

| 4,879,690 | A | 11/1989 | Anami et al. |
| 5,450,365 | A | 9/1995 | Adachi |
| 6,038,187 | A | 3/2000 | El Hajji |
| 6,501,306 | B1 | 12/2002 | Kim et al. |
| 6,920,060 | B2 | 7/2005 | Chow et al. |
| 7,000,214 | B2 | 2/2006 | Iadanza et al. |
| 7,019,559 | B2 | 3/2006 | Kouzuma |
| 7,098,692 | B2 | 8/2006 | Joshi et al. |
| 7,120,061 | B2 | 10/2006 | Daga |
| 7,218,562 | B2 * | 5/2007 | Campbell ...................... 365/203 |
| 7,245,532 | B2 | 7/2007 | Jyouno et al. |
| 7,355,905 | B2 | 4/2008 | Campbell et al. |
| 7,474,571 | B2 | 1/2009 | Campbell |
| 7,489,576 | B2 * | 2/2009 | Hirota et al. .................. 365/203 |
| 7,652,504 | B2 | 1/2010 | Campbell |
| 7,697,354 | B2 * | 4/2010 | Brede et al. .................... 365/200 |
| 7,929,364 | B2 * | 4/2011 | Lee et al. ....................... 365/203 |
| 2001/0008491 | A1 | 7/2001 | Sumimoto |

(Continued)

OTHER PUBLICATIONS

Office Action from U.S. Appl. No. 12/634,791, mailed Apr. 20, 2010, all pages.

(Continued)

*Primary Examiner* — Hoai V Ho
(74) *Attorney, Agent, or Firm* — Lawrence J. Merkel; Meyertons, Hood, Kivlin, Kowert & Goetzel, P.C.

(57) ABSTRACT

In one embodiment, an integrated circuit includes a logic circuit and a memory circuit that includes multiple bit lines and bit line precharge circuits. The memory circuit may include level shifters for control signals generated from logic circuit inputs, and particularly there may be one or more level shifters that generate precharge enable signals to control the bit line precharge circuits. The level shifters for the bit line precharge circuits may also be controlled, during periods of time that the memory circuit is idle, by an input control signal (FloatBL herein). If the FloatBL signal is asserted, the bit line precharge circuits may be disabled to float the bit lines. In some embodiments, the FloatBL signal may also disable bit line bit line hold circuits on the bit lines. In some embodiments, when the memory circuit is exiting an idle state, the bit line precharge circuits may be enabled in a staggered fashion.

19 Claims, 8 Drawing Sheets

U.S. PATENT DOCUMENTS

| | | | |
|---|---|---|---|
| 2003/0206457 | A1 | 11/2003 | Hidaka |
| 2004/0042334 | A1* | 3/2004 | Sasaki et al. .................. 365/236 |
| 2004/0232944 | A1 | 11/2004 | Bu et al. |
| 2005/0237099 | A1 | 10/2005 | Tachibana et al. |
| 2006/0274587 | A1 | 12/2006 | Houston |
| 2008/0123437 | A1 | 5/2008 | Agarwal et al. |
| 2009/0109775 | A1* | 4/2009 | Hwang .......................... 365/203 |

OTHER PUBLICATIONS

U.S. Appl. U.S. Appl. No. 12/634,791, filed Dec. 10, 2009, all pages.

"A Sub-1W to 2W Low-Power IA Processor for Mobile Internet Devices and Ultra-Mobile PCs in 45nm Hi-K Metal Gate CMOS," ISSCC 2008 / Session 13 / Mobile Processing / 13.1, 2008 IEEE International Solid-State Circuits Conference, 3 pages.

Heo, et al., "Dynamic Fine-Grain Leakage Reduction Using Leakage-Biased Bitlines," The 29th Annual Int'l Symposium for COmputer Architecture (ISCA-29), Anchorage, AK, May 2002, 11 pages.

P.A. Semi, Inc. "The PWRficient Processor Family," Jan. 2006, pp. 1-31.

* cited by examiner

LEAKAGE AND NBTI REDUCTION TECHNIQUE FOR MEMORY

This application is a divisional of U.S. application Ser. No. 12/492,364, which was filed on Jun. 26, 2009, now issued as U.S. Pat. No. 7,995,410 which is incorporated herein by reference.

BACKGROUND

1. Field of the Invention

This invention is related to the field of integrated circuits and, more particularly, to memories in integrated circuits.

2. Description of the Related Art

As the number of transistors included on a single integrated circuit "chip" has increased and as the operating frequency of the integrated circuits has increased, the management of power consumed by an integrated circuit has continued to increase in importance. If power consumption is not managed, meeting the thermal requirements of the integrated circuit (e.g. providing components required to adequately cool the integrated circuit during operation to remain within thermal limits of the integrated circuit) may be overly costly or even infeasible. Additionally, in some applications such as battery powered devices, managing power consumption in an integrated circuit may be key to providing acceptable battery life.

One mechanism for managing power may including idling portions of the integrated circuit that are not in use. In the case of an on-chip memory such as a cache or embedded memory, idling the memory typically includes holding the bit lines in the memory in a precharge state by keeping the bit line precharge circuits active. However, there may be a significant amount of leakage current in the inactive transistors within the memory, and the active precharge circuits supply charge that can be further leaked, consuming power. Additionally, transistors are subject to aging effects such as negative bias temperature instability (NBTI). Keeping the precharge circuit transistors active during long idle periods can lead to significant NBTI. Accordingly, the precharge circuit transistors are typically designed to be larger than they would otherwise need to be, so that they can precharge the bit lines effectively even after NBTI effects have started to accumulate.

SUMMARY

In one embodiment, an integrated circuit includes a logic circuit and a memory circuit that includes multiple bit lines and bit line precharge circuits. The logic circuit that interfaces to the memory may operate at a different power supply voltage than the memory, and thus the memory circuit may include level shifters for control signals generated from the logic circuit inputs, to shift to the power supply voltage of the memory. In an embodiment, for example, there may be one or more level shifters that generate precharge enable signals to control the bit line precharge circuits. The level shifters for the bit line precharge circuits may also be controlled, during periods of time that the memory circuit is idle, by an input control signal (FloatBL herein). If the FloatBL signal is asserted, the bit line precharge circuits may be disabled to float the bit lines. In some embodiments, the FloatBL signal may also disable bit line hold circuits on the bit lines (which may hold the precharge on the non-discharged bit line during a read/write operation when the memory circuit is in use). In some embodiments, when the memory circuit is exiting an idle state, the bit line precharge circuits may be enabled in a staggered fashion.

BRIEF DESCRIPTION OF THE DRAWINGS

The following detailed description makes reference to the accompanying drawings, which are now briefly described.

Figure 1:
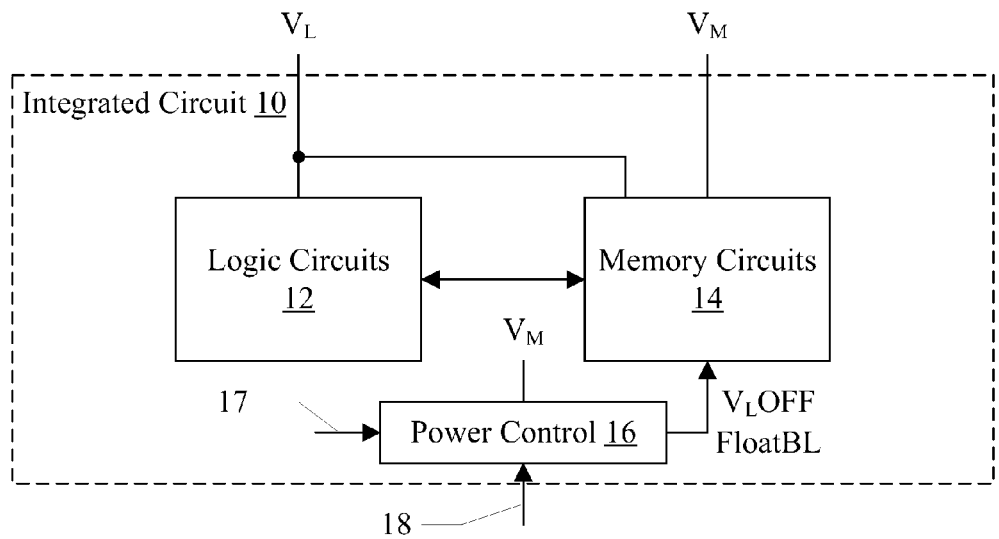
FIG. 1 is a block diagram of one embodiment of an integrated circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Turning now to FIG. 1, a block diagram of one embodiment of an integrated circuit 10 is shown. In the illustrated embodiment, the integrated circuit includes a plurality of logic circuits 12, a plurality of memory circuits 14, and a power control circuit 16. The logic circuits 12 are coupled to the memory circuits 14. The power control circuit 16 is coupled to the memory circuits 14 (specifically, via a $V_L$OFF signal and a FloatBL signal). The logic circuits 12 are powered by a first supply voltage provided to the integrated circuit 10 (labeled $V_L$ in FIG. 1). The memory circuits 14 and the power control circuit 16 are powered by a second power supply voltage provided to the integrated circuit 10 (labeled $V_M$ in FIG. 1). In the illustrated embodiment, the memory circuits 14 are also powered by the $V_L$ supply voltage, as will be explained in more detail for certain embodiments below. The integrated circuit 10 may generally comprise the logic circuits 12, the memory circuits 14, and the power control circuit 16 integrated onto a single semiconductor substrate (or chip).

The logic circuits 12 may generally implement the operation for which the integrated circuit is designed. The logic circuits 12 may generate various values during operation, which the logic circuits 12 may store in (or write to) the memory circuits 14. Additionally, the logic circuits 12 may read various values on which to operate from the memory circuits 14. For example, in various embodiments, the memory circuits 14 may include memory used for caches, register files, integrated-circuit-specific data structures, etc. The memory circuits 14 may implement any type of readable/writeable memory. In an example below, an SRAM memory will be used. It is noted that, while the illustrated embodiment includes a plurality of logic circuits 12 and a plurality of memory circuits 14, various embodiments may include at least one logic circuit 12 and at least one memory circuit 14.

Generally, if a logic circuit 12 is to access a memory circuit 14, the logic circuit 12 may generate various control signals to the memory circuit 14. For example, the control signals may include an address identifying the memory location in the memory circuit 14 that is to be accessed, a read enable signal which may be asserted to perform a read, and a write enable signal which may be asserted to perform a write. For a read, the memory circuit 14 may output data to the logic circuit 12. For a write, the logic circuit 12 may supply data to the memory circuit 14 for storage.

By separating the supply voltage for the logic circuits 12 and the memory circuits 14, the supply voltage for the logic circuits 12 ($V_L$) may be reduced below the level at which the memory circuits 14 may operate robustly. The supply voltage for the memory circuits 14 ($V_M$) may be maintained at the minimum supply voltage that provides for robust memory operation (or greater, if desired). Thus, the $V_L$ supply voltage may be less than the $V_M$ supply voltage during use. At other times, the $V_L$ supply voltage may exceed the $V_M$ supply voltage during use (e.g. at times when higher performance is desired and higher power consumption is acceptable to achieve the higher performance). Alternatively, the $V_M$ supply voltage may be increased to match the $V_L$ supply voltage if the $V_L$ supply voltage would otherwise exceed the $V_M$ supply voltage.

In one embodiment, the $V_L$ supply voltage may even be powered down (that is, reduced to the ground reference) while the $V_M$ supply voltage remains active to retain data in the memory circuits 14. The power control circuit 16 may monitor various inputs (internal, illustrated by arrow 17, and/or external, illustrated by arrow 18) to determine that the $V_L$ supply voltage is to be powered down. In one embodiment, the power control circuit 16 may determine that the $V_L$ supply voltage is to be powered down and may issue a power down request to an external power source such as a voltage regulator (not shown in FIG. 1) that supplies the $V_L$ voltage. In other embodiments, internal or external inputs may indicate that the power down is to occur, and the power control unit 16 may detect the event by monitoring the inputs. In either case, the power control unit 16 may assert the $V_L$OFF signal to the memory circuits 14. The $V_L$OFF signal may be active high (where the asserted state indicating that the $V_L$ voltage is to be powered off is the logical one state) or active low (where the asserted state is the logical zero state). The deasserted state is the opposite of the asserted state in either case. Various level shifters in the memory circuits 14 may use the $V_L$OFF signal to assert a predetermined output to other circuitry in the memory circuits 14, as described in more detail below.

When $V_L$ is to be powered down, the memory circuits 14 may generally be idle. Accordingly, in response to the $V_L$OFF signal assertion, the bit line precharge circuits may be activated to precharge the bit lines and hold them in the precharge state during the idle time. In the present embodiment, the integrated circuit 10 also supports the FloatBL signal. The FloatBL signal may be asserted (high or low, with the opposite logical state indicating deasserted) to cause the memory circuits 14 to float the bit lines. The bit lines may be floated, e.g., by disabling the bit line precharge circuits. Additionally, in some embodiments, the memory circuits 14 may include bit line hold circuits which attempt to maintain the precharge on the bit line of a pair that is not discharged during a read or write. The bit line hold circuits may also be disabled responsive to assertion of the FloatBL signal. Generally, a bit line may be referred to as floating if the bit line is not actively being driven to a particular voltage (e.g. by a transistor that is on).

In an embodiment, the FloatBL signal may be programmable in the power control circuit 16. For example, the FloatBL signal may be programmed into a register in the power control circuit 16, input to the power control circuit 16 on a pin to the integrated circuit 10, etc. Accordingly, the FloatBL signal may be a low risk design addition, in some embodiments. If unforeseen problems occur in floating the bit lines in the memory circuits 14 during idle times, the FloatBL signal may be programmed to be deasserted.

Generally, a supply voltage may be a voltage provided to a circuit to power the circuit, providing the electrical energy to permit the circuit to generate one or more outputs responsive to one or more inputs. At various points herein, supply voltages may be referred to as being greater than or less than other supply voltages. That is, the magnitude of the voltage may be greater than (or less than) the magnitude of the other voltage.

It is noted that, while powering off the $V_L$ supply voltage is an example in which the memory circuits 14 may be idle and the bit lines may be floated, other embodiments may detect that the memory circuits may be idle in other fashions, in addition to or instead of powering off the $V_L$ supply voltage. For example, the logic circuits 12 may signal that they will not be accessing the memory circuits 14 for a period of time. For example, if the logic circuits 12 include floating point processing circuitry and the floating point processing circuitry is not being used with the current workload, the logic circuits 12 may detect that the memory circuits 14 that store only floating point values will be idle. Other types of processing may similarly become idle for a given workload, and corresponding memory circuits 14 may be idle. In such cases, the power control unit 16 may implement a control signal similar to $V_L$OFF to signal the idle condition for the affected memory circuits 14, and may assert the FloatBL signal to the affected memory circuits 14.

Figure 2:
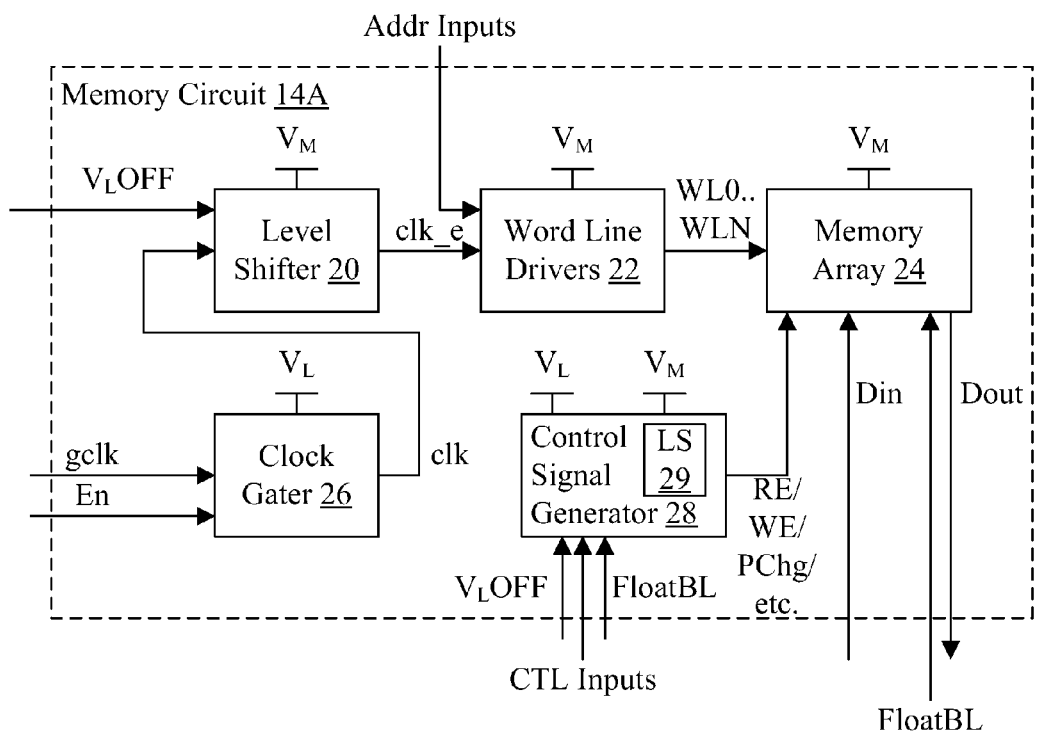
FIG. 2 is a block diagram of one embodiment of a memory circuit shown in FIG. 1.

Turning now to FIG. 2, a block diagram of one embodiment of a memory circuit 14A is shown. The memory circuit 14A may be one of the memory circuits 14. Other memory circuits 14 may be similar. In the embodiment of FIG. 2, the memory circuit 14A includes a level shifter circuit 20, a set of word line driver circuits 22, a memory array 24, a clock gater circuit 26, and a control signal generator circuit 28. The level shifter 20, the memory array 24, and the word line drivers 22 are supplied by the $V_M$ supply voltage. The control signal generator 28 is supplied by both the $V_M$ and the $V_L$ supply voltages. The clock gater 26 is supplied by the $V_L$ supply voltage. The clock gater 26 is coupled to receive a clock input (gclk) and one or more enable inputs (En) from the logic circuits 12. The output of the clock gater 26 (clk) is coupled as an input to the level shifter 20, which is also coupled to receive the $V_L$OFF signal. The level shifter 20 is also configured to generate a clock output (clk_e) to the word line drivers 22. The word line drivers 22 are further coupled to receive one or more address inputs (Addr inputs) from the logic circuits 12. The word line drivers 22 are configured to generate a set of word lines to the memory array 24 (WL0 ... WLN). The memory array 24 is further coupled to receive data (Din) and provide data (Dout) to/from the logic circuits 12. Additionally, the memory array 24 is coupled to receive various control signals from the control signal generator 28. For example, the control signals may include a write enable (WE) signal and a read enable (RE) signal. The control signals may also include a precharge enable (PChg) signal, and any other desired control signals. In the illustrated embodiment, the control signal generator circuit 28 includes one or more level shifters (LS) 29.

The control signal generator 28 may generate the control signals for the memory array 24 from corresponding control inputs from the logic circuits 12. The control signal generator circuit 28 may receive the $V_L$OFF signal, and may also receive the FloatBL signal for use with the level shifters 29. The memory array 24 is further coupled to receive the FloatBL signal as shown in FIG. 2.

The memory array 24 may comprise a plurality of memory cells that are supplied by the $V_M$ supply voltage. However, the memory circuit 14A is designed to provide for access to the memory array 24 by the logic circuits 12, even if the logic circuits 12 are supplied with a $V_L$ supply voltage that is less than the $V_M$ supply voltage. Each memory cell is activated for access (read or write) by one of the word lines WL0 ... WLN coupled to that memory cell. One or more memory cells coupled to the same word line form a "word" for access in the memory array 24. That is, the bits of the word may be read/written as a group. The width of the word may thus be the width of the Din and Dout signals from the memory array 24.

Since the memory cells are supplied by the $V_M$ supply voltage, the word lines may also be supplied by the $V_M$ supply voltage. That is, when a word line is asserted high, the word line may be at approximately a $V_M$ voltage. Thus, the word line drivers 22 are supplied with the $V_M$ supply voltage.

The word line drivers 22 activate a given word line based on address inputs from the logic circuits 12. The address identifies the word in the memory array 24 to be accessed for a given access generated by the logic circuits 12. In some embodiments, the logic circuits 12 may include circuits that partially or fully decode the address, and the address inputs may be the partially or fully decoded address. Alternatively, the word line drivers 22 may implement the full decode function and the address inputs may encode the address. Generally, each different address causes a different word line WL0 to WLN to be asserted.

Since the word line drivers 22 are supplied with the $V_M$ supply voltage, inputs to the word line drivers 22 that are coupled to the gates of p-type metal oxide semiconductor (PMOS) transistors in the word line drivers 22 may be driven to a $V_M$ voltage when driven high (to ensure that the PMOS transistors, which are supplied with a $V_M$ supply voltage, are fully turned off when the gate is driven high). That is, if the gate of the PMOS transistor is driven to a voltage less than the $V_M$ supply voltage on its source, the gate to source voltage of the PMOS transistor is still negative and thus the PMOS transistor may still be active even though it is logically intended to be inactive. If the word line drivers 22 were designed with static complementary MOS (CMOS) circuits, each input would be coupled to the gate of a PMOS transistor and would be driven to a $V_M$ voltage when driven high. In one embodiment, the word line drivers 22 may be implemented with dynamic logic gates. Thus, the clock signal that precharges the circuit (clk_e) is coupled to the gate of a PMOS transistor and may be driven to a $V_M$ voltage. Other signals, coupled to the gates of n-type MOS (NMOS) transistors, may be driven with the $V_L$ voltage. Thus, the address inputs from the logic circuits 12 may be provided directly to the word line drivers 22 (without level shifting).

The level shifter 20 is configured to generate the clk_e signal responsive to the clk signal from the clock gater 26. If the clock is enabled for the current clock cycle, the level shifter 20 may generate the clk_e signal by level shifting the input clk signal such that the high assertion of the clk_e signal is at a $V_M$ voltage.

Additionally, the level shifter 20 may be designed to provide a predetermined voltage level on the output signal (clk_e, in FIG. 2) if the $V_L$ supply voltage is to be powered down, independent of the input signal to the level shifter 20. Since the input signal is generated by circuitry powered by the $V_L$ supply voltage (and thus is powered down), the input signal may be at a ground voltage (or may even float at indeterminate levels). By providing the predetermined voltage level during such time periods, the level shifter 20 may provide predictable behavior for the receiving circuitry. If predicable behavior was not provided, various undesired effects could occur. For example, for the embodiment of FIG. 2 (in which the level shifter provides signals for the memory circuitry), data in the memory could be accidentally overwritten. Or, circuitry that normally is not active at the same time (e.g. bit line prechargers and word line drivers) could be active at the same time and thus cause contention, which could damage the memory circuits and/or cause undesirable power consumption. Still further, when the $V_L$ supply voltage is powered up again, unpredictable logic circuit initializations and/or transitions on the input signals to the level shifter may occur, but the forced value on the output may prevent such unpredictable behavior from reaching the memory circuits. In the present embodiment, the assertion of the $V_L$OFF signal indicates that the $V_L$ supply voltage is to be powered down, and the $V_L$OFF signal may remain asserted while the $V_L$ supply voltage is off, in this embodiment.

The predetermined voltage level may be the level that is considered "safe" for the receiving circuitry. For example, in the case of FIG. 2, the clk_e signal is coupled to the gate of a PMOS transistor in the word line drivers 22, as mentioned above. Accordingly, the safe voltage would be the high ($V_M$) voltage, so that the PMOS transistor is inactive. In other cases, the safe voltage may be the low (ground) voltage, or any other desired voltage level. Various level shifters may implement various predetermined voltage levels, even in the same design, dependent on the safe voltage levels for the receiving circuitry.

In an embodiment, the level shifters 29 may also be configured to provide "safe" input signal values with $V_L$OFF is asserted. For example, the precharge enable signal(s) (PChg in FIG. 2) may be asserted (low) to enable the bit line precharge circuits. Alternatively, in an embodiment, the level shifters 29 may also receive the FloatBL signal. If the FloatBL signal is asserted, the precharge enable signals may be deasserted (high), disabling the bit line precharge circuits in the memory array 24. Disabling the bit line precharge circuits may reduce the NBTI effects on the transistors in the bit line precharge circuits, in an embodiment. Additionally, in an embodiment, leakage may be reduced since the bit line precharge circuits are disabled and not actively supplying current to be leaked. In embodiments in which bit line hold circuits are implemented, the memory array 24 may also receive the FloatBL signal to disable the bit line hold circuits.

Generally, a level shifter circuit may be a circuit configured to level shift an input signal to produce an output signal. Level shifting a signal may refer to changing the high assertion of the signal from one voltage to another. Level shifting may be performed in either direction (e.g. the voltage after level shifting may be higher or lower than the voltage before level shifting). In some embodiments, the low assertion may remain the ground voltage supplied to the integrated circuit 10 (not shown in the figures, often referred to as $V_{SS}$).

The clock gater 26 generates the clk signal responsive to the En signal (or signals) and the gclk signal (similar to the discussion above for the level shifter). If the En signal (or signals) indicate that the clock is enabled for the current clock cycle, the clock gater 26 may generate the clk signal responsive to the gclk signal. If the En signal (or signals) indicate that the clock is disabled, the clock gater 26 may hold the clk signal steady at a low level (ground). In other implementations, the clock gater 26 may hold the clk signal steady at a high level ($V_L$) if the En signal (or signals) indicate that the clock is disabled.

As mentioned above, the memory circuit 14A is designed to provide read/write access to the memory array 24 even if the $V_M$ supply voltage is higher than the $V_L$ supply voltage. The level shifter 20 level-shifting input signals and the word line drivers 22 operating at the $V_M$ voltage provide the start of an access. The Din and Dout signals provide the data in (for a write) or the data out (for a read), and thus are in the $V_L$ domain used by the logic circuits 12 in this embodiment. The memory array 24 may also be supplied with the $V_L$ voltage, and may be configured to operate with the Din and Dout signals in the $V_L$ domain. In other embodiments, the Din and Dout signals may be level shifted between the $V_L$ and $V_M$ domains, or only the Din signals may be level shifted and the Dout signals may be in the $V_M$ domain.

Figure 3:
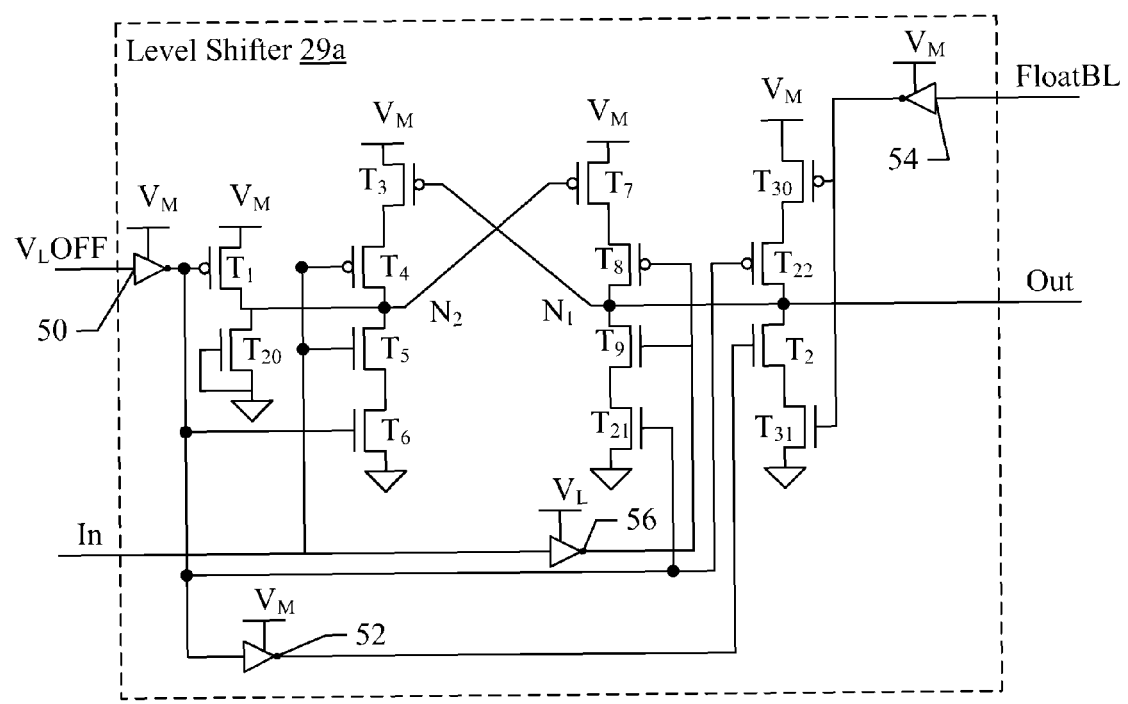
FIG. 3 is a circuit diagram of one embodiment of a level shifter shown in FIG. 2.

Turning now to FIG. 3, a circuit diagram of one embodiment 29a of the level shifter(s) 29 is shown. In the embodiment of FIG. 3, the level shifter 29a includes a shift stage comprising transistors $T_1$-$T_9$ and $T_{20}$-$T_{22}$. $T_3$ has a source coupled to the $V_M$ supply voltage, a gate coupled to a node N1, and a drain coupled to the source of $T_4$. The gates of $T_4$ and $T_5$ are coupled to receive an input signal (In), which may be the output of the NAND gate 30 in FIG. 2. Generally, however, any input signal may be used. The drains of $T_1$, $T_4$, $T_5$, and $T_{20}$ are coupled to the node N2. The source of $T_5$ is coupled to the drain of $T_6$, and the source of $T_6$ is coupled to ground. The gate of $T_6$ is coupled to an inversion of the $V_L$OFF signal, output from the inverter 50. The output of the inverter 50 and is also coupled to the gate of $T_1$, which has its source coupled to the $V_M$ supply voltage. The In signal is input to an inverter 56 which has its output coupled to the gates of $T_8$ and $T_9$. The source of $T_9$ is coupled to the drain of $T_{21}$, which has its source coupled to ground and its gate coupled to the output from the inverter 50. The drains of $T_8$ and $T_9$ are coupled to the node N1. The source of $T_8$ is coupled to the drain of $T_7$, which has its source coupled to the $V_M$ supply voltage. The gate of the transistor $T_7$ is coupled to the node N2. The node N1 is the output of the shift stage, and may be the output of the level shifter 29a in this embodiment. Other embodiments may include an output inverter, and the node N1 may be the input to the output inverter. The drain of $T_2$ is coupled to the node N1, and the source of $T_2$ is coupled the drain of a transistor $T_{31}$, which has its source coupled to ground. The gate of $T_2$ is coupled to the output of an inverter 52, which has its input coupled to the output of the inverter 50. The gate of the transistor $T_{31}$ is coupled to the output of an inverter 54, which is coupled to receive the FloatBL input. The drain of $T_{22}$ is coupled to the node N1, and the source of $T_{22}$ is coupled to the drain of a transistor $T_{30}$, which has its source coupled to the $V_M$ supply voltage. The gate of $T_{22}$ is coupled to the output of the inverter 50, and the gate of $T_{30}$ is coupled to the output of the inverter 54. The transistor $T_{20}$ has its gate and source coupled to ground.

Operation of the shift stage will first be described, assuming that the $V_L$OFF signal is deasserted. When the input signal (In) transitions from low to high, $T_5$ is activated and begins discharging node N2. $T_4$ is also deactivated by the input signal transition, isolating the node N2 from $T_3$. As the node N2 discharges, $T_7$ activates and begins charging node N1 to the $V_M$ supply voltage ($T_8$ is also activated, and $T_9$ is deactivated, by the transition to low on the output of the inverter 56 due to the transition high of the input signal). Accordingly, N1 results in the same logical state as the input signal, at the $V_M$ supply voltage. When the input signal transitions from high to low, the output of the inverter 56 transitions from low to high and $T_9$ is activated. $T_9$ begins discharging the node N1. $T_8$ is also deactivated by the input signal transition, isolating the node N1 from $T_7$. Thus, the node N1 is discharged to ground. As the node N1 discharges, $T_3$ activates and begins charging node N2 to the $V_M$ supply voltage ($T_4$ is also activated by the transition to low of the input signal), thus deactivating $T_7$.

In this embodiment, the level shifter 29a also provides a forced, predetermined voltage on the output if the $V_L$OFF signal is asserted (high), dependent on the FloatBL signal. If the $V_L$OFF signal is asserted, $T_2$ and $T_{22}$ are activated. If the FloatBL signal is deasserted (low), the output of the inverter 54 is high and $T_{31}$ is activated. The combination of $T_2$ and $T_{31}$ discharges node N1 to ground. $T_1$ is also activated and charges node N2 to the $V_M$ voltage. This forces a value of ground on node N1. $T_6$ is deactivated, preventing $T_5$ from affecting the node N2, and $T_{21}$ is also deactivated. $T_7$ is deactivated as the node N2 charges. Thus, the output node N1 may be held steady at ground if the $V_L$OFF signal is asserted, independent of the state of the input signal. If the $V_L$OFF signal is deasserted (low), $T_6$ and $T_{21}$ are activated via the output of the inverter 50 and thus the shift stage may operate as described above. $T_2$ is deactivated via the output of the inverter 52, and $T_1$ is also inactive. Transistors $T_1$, $T_2$, and $T_6$ establish voltages on the internal nodes N1 and N2 that are consistent with the desired output signal level. On the other hand, if the FloatBL signal is asserted (high), the output of the inverter 54 is low, activating the transistor $T_{31}$. $T_{22}$ is activated via the assertion of the $V_L$OFF signal, since the output of the inverter 50 is low. The combination of transistors $T_{31}$ and $T_{22}$ pulls the node N1 high, and thus the output is high in this case. Other embodiments may define the asserted and deasserted states of the FloatBL signal differently, and the inverter 54 may be eliminated. Additionally, if the output inverter is included in the level shifter 29a, the inverter 54 may be eliminated as well.

Accordingly, the FloatBL signal programs the output of the level shifter 29a (for times in which the $V_L$OFF signal is asserted) to be low or high via assertion or deassertion of the FloatBL signal. In the case of the level shifter(s) 29 that generate the precharge enable signals, the FloatBL being high disables the bit line precharge circuits and the FloatBL signal being low enables the bit line precharge circuits. It is noted that other embodiments may not include the FloatBL signal (e.g. the level shifter 20 in FIG. 2). Such embodiments may be similar to the embodiment of FIG. 2, except that $T_{30}$ and $T_{31}$ may be eliminated. The source of $T_2$ may be coupled to ground, and the gate and source of $T_{22}$ may be coupled to the $V_M$ supply voltage.

In the illustrated embodiment, the functionality of the FloatBL signal may be added to the level shifter 29a without introducing significant additional delay in the level shifter. In cases where the level shifter 29a is on a critical timing path, the lack of additional delay may be useful.

The operation of the active transistors $T_1$-$T_9$ in the shift stage has been described. However, if only the transistors $T_1$-$T_9$ were included, the shift stage would be asymmetrical. For example, node N2 has a PMOS load for the $V_L$OFF signal, while the node N1 has an NMOS load for the $V_L$OFF signal. To provide a more symmetric circuit, the transistors $T_{20}$ (and $T_{22}$, in embodiments that eliminate the FloatBL signal) are inserted into the level shifter 29a. The transistor $T_{20}$ may be referred to as "dummy transistors". Dummy transistors may not be required for the functionality of the circuit, but rather may be provided to match functional transistors elsewhere in the circuit. For example, the transistor $T_{20}$ may match the transistor $T_2$. A dummy transistor may match a corresponding other transistor if the dummy transistor provides similar electrical performance as the other transistor (e.g. load, current if active, etc.). For example, in one embodiment, the dummy transistor may sized the same as the corresponding other transistor. In embodiments in which circuit symmetry is not needed, the dummy transistors may be eliminated.

The dummy transistors may have their gates tied to a static voltage. For example, the dummy transistors may be coupled to the power supply voltage ($V_M$) or ground. The dummy transistors may be tied in the "on" state (active) or the "off" state (inactive). If the dummy transistors are provided to present a load, but do not need to be on for functionality, the dummy transistors may be in the "off" state, which conserves power (e.g. the transistors $T_{20}$, and $T_{22}$ if the FloatBL signal is not included). If the transistors need to be on for functionality, the dummy transistor may be in the "on" state.

A static voltage may refer to a voltage which is nominally held at a fixed level during use. That is, the voltage is not a signal that is expected to vary during use. In actuality, there may be some variation (e.g. due to noise, voltage droop under load, etc.).

$T_4$ and $T_8$ may limit power dissipation during transition, by isolating the nodes N2 and N1, respectively, from $T_3$ and $T_7$, respectively. $T_3$ and $T_7$ may be delayed in deactivating with respect to the activation of $T_5$ and $T_9$, respectively, since $T_3$ and $T_7$ are deactivated through the charging of nodes N1 and N2, respectively. By isolating $T_3$ and $T_7$ from their respective nodes N2 and N1 when $T_5$ and $T_9$ are activated, $T_3$ and $T_7$ may be prevented from fighting the discharge of their respective nodes N2 and N1. $T_4$ and $T_8$ are optional and may be deleted in other embodiments. In such embodiments, the drains of $T_3$ and $T_7$ may be coupled to the drains of $T_5$ and $T_9$, respectively.

Various transistors in FIG. 3 may have gate terminals coupled to receive the $V_L$OFF signal or its complement (inverse). Accordingly, the transistors may generally be controlled responsive to the $V_L$OFF signal. It is noted that, while various nodes/signals are described as being charged/discharged to a given voltage level, there may be some variation in voltage levels on nodes. Accordingly, a node may generally be charged/discharged (or driven) to approximately the given voltage level.

It is noted that the transistors in the embodiment of FIGS. 3 and 4 (discussed below) may be PMOS or NMOS transistors, using the standard symbols for such transistors. That is, a transistor with a gate terminal having an open circle (e.g. the transistor $T_1$) is a PMOS and a transistor with a gate terminal having no open circle (e.g. the transistor $T_2$) is an NMOS.

It is noted that, while logic circuits that may be powered down and memory circuits that may remain powered, with level shifters as described above in between, are shown in this embodiment, other embodiments may be used in other fashions. Generally, there may be source circuitry powered by one supply voltage (that may be powered down) that supplies signals to level shifters and receiving circuitry powered by another supply voltage that receives the level shifted outputs from the level shifters (and that may remain powered when the source circuitry's supply voltage is powered down). Alternatively, the level shifter may be coupled between any two voltage domains and may receive two or more inputs upon which a logical operation and level shift is performed by the level shifter.

In some embodiments, if the logic circuitry that generates the input signal (In) may ensure that the input signal is in a particular state when the $V_L$OFF signal is asserted and that the input signal does not change state with the $V_L$OFF signal is asserted, the design of the level shifter 29a may be modified.

For example, the transistor $T_{21}$ may be eliminated and the source of the transistor $T_9$ may be connected to the drain of the transistor $T_6$.

Transistors may generally be designed to have a nominal threshold voltage. The nominal threshold voltage may be the threshold voltage expected of the transistor based on the design of the transistor (e.g. channel length, oxide thickness and material, etc.). For a given process technology node, there may be two or more types of transistors available with differing threshold voltages. For example, in one embodiment, there are four types of transistors available (listed from lowest threshold voltage to highest threshold voltage): ultra-low threshold voltage (ULVT), low threshold voltage (LVT), medium threshold voltage (MVT), and high threshold voltage (HVT). ULVT has the lowest nominal threshold voltage; LVT is higher than ULVT; MVT is higher than LVT; and HVT is higher than MVT. In one embodiment, an additional transistor type is available: ultra-high threshold voltage (UHVT), having a nominal threshold voltage that is higher than HVT. The threshold voltage is referred to as nominal because in practice the actual threshold voltage may vary based on process variations, as well as operating conditions such as temperature. Generally, the lower the nominal threshold voltage of a given transistor, the higher the leakage current in that given transistor may be.

The threshold voltage may generally refer to the voltage at the gate terminal of the transistor (with respect to the source), at or above which the transistor actively conducts current between the source and drain. Viewed in another way, the threshold voltage may be the voltage at which a low resistance current path is formed from the source to the drain. When the gate to source voltage is less than the threshold voltage, the transistor is not actively conducting current. Leakage current may be flowing when the gate to source voltage is less than the threshold voltage, but the leakage current is significantly smaller than the active current (e.g. by orders of magnitude). The transistor is referred to as "on" when the gate to source voltage exceeds the threshold voltage and "off" when the gate to source voltage does not exceed the threshold voltage. The nominal threshold voltage of the transistors in FIG. 4 may be varied, as described above.

Figure 4:
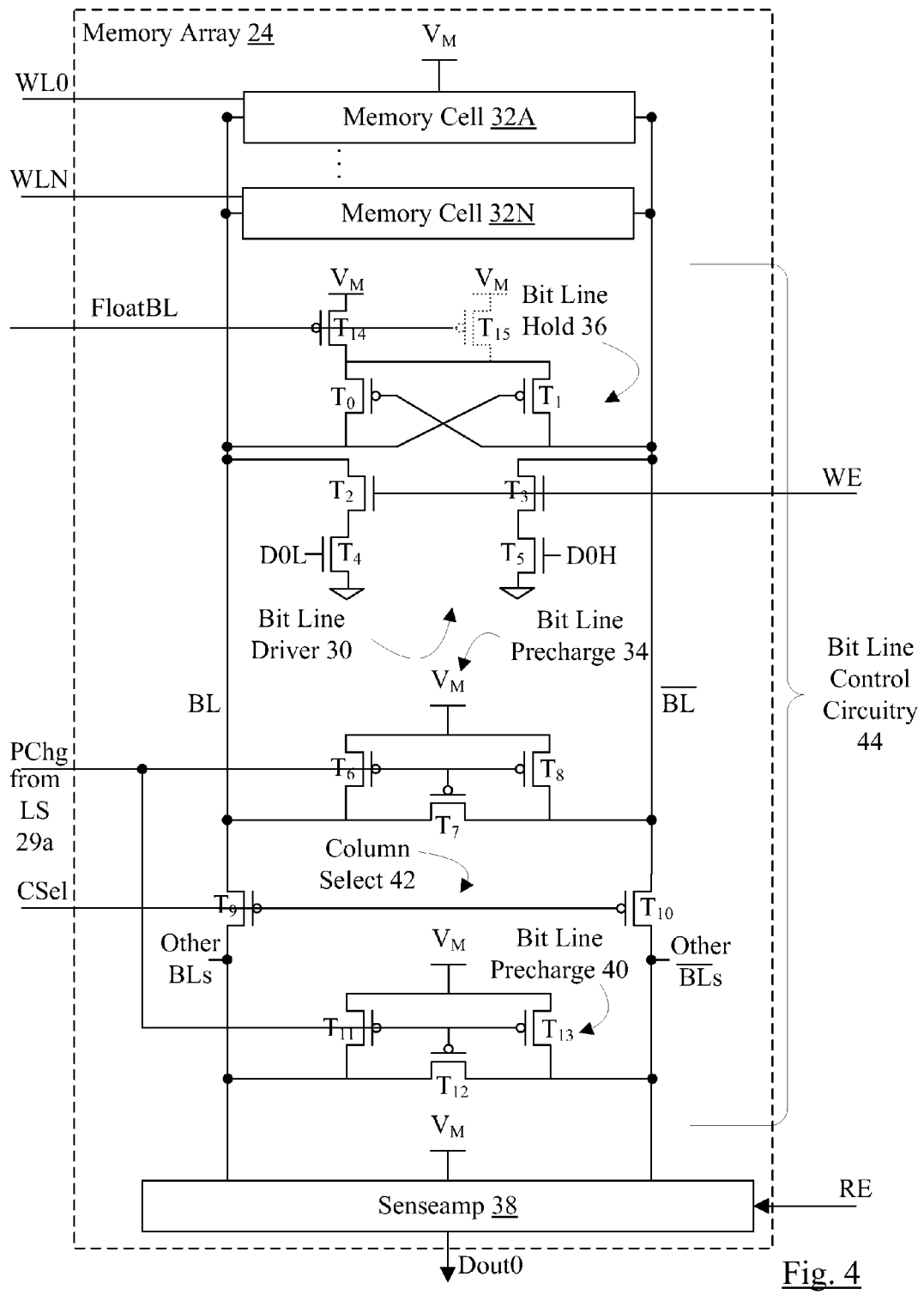
FIG. 4 is a circuit diagram of one embodiment of a portion of a memory array shown in FIG. 2.

Turning now to FIG. 4, a circuit diagram of a portion of one embodiment of the memory array 24 is shown. The portion shown in FIG. 4 may correspond to bit 0 of the Din and Dout signals (shown as the differential pair D0L and D0H for Din bit 0 and Dout0 for Dout bit 0 in FIG. 4). Other portions similar to the portion shown in FIG. 4 may be implemented for other bits in the Din/Dout word. In the embodiment of FIG. 4, the memory array 24 includes memory cells 32A-32N, a senseamp 38, and bit line control circuitry 44. In the illustrated embodiment, the bit line control circuitry 44 includes a bit line driver circuit 30, a bit line precharge circuit 34, a bit line hold circuit 36, a second bit line precharge circuit 40, and a column select circuit 42. The circuitry in FIG. 4 is supplied with the $V_M$ supply voltage. The bit line driver 30, the memory cells 32A-32N, the bit line precharge circuit 34, the bit line hold circuit 36, and the column select circuit 42 are coupled to a pair of bit lines (BL and BL bar, the latter labeled as BL with a bar over it in FIG. 4). The column select circuit 42, the second bit line precharge circuit 40, and the senseamp 38 are coupled to a second pair of bit lines, which may include the output of the column select circuit 42 and one or more other column select circuits 42 that are logically ORed by connecting the outputs together and selecting one of the column select circuits 42 (shown as other BLs and other BLs bar in FIG. 4). The memory cell 32A is coupled to word line WL0, and the memory cell 32N is coupled to the word line WLN.

Other memory cells, not explicitly shown in FIG. 4 but indicated by the ellipses between the memory cells 32A and 32N, are coupled to other word lines. The bit line precharge circuit 34 and the second bit line precharge circuit 40 are coupled to a precharge enable signal (PChg in FIG. 4) from the level shifter 29a shown in FIG. 3, which may be part of the control signal generator 28 in FIG. 2. The column select circuit 42 is coupled to receive a column select signal CSel. The bit line drivers 30 are coupled to receive the D0H/D0L signal pair and the write enable (WE) signal. The senseamp 38 is coupled to the Dout0 signal and the read enable (RE) signal. The bit line hold circuit 36 is coupled to receive the FloatBL signal.

The memory cells 32A-32N may be for example, six transistor (6T) CMOS SRAM cells. In such cells, a pair of cross-coupled inverters form the storage cells and are coupled to the bit lines BL and BL bar through a pair of pass gate transistors that are controlled by the word line to the cell. In one embodiment, the transistors in the memory cells 32A-32N may be MVT transistors. In one embodiment, the transistors in the memory array 24, unless otherwise described, may be MVT transistors. Other embodiments may use other transistor types.

Generally, the bit lines may be used to transfer a bit into and out of a memory cell 32A-32N that is activated using the corresponding word line. The bit lines represent the bit differentially, with BL being the true value of the bit and BL bar being the complement of the bit.

To perform a write operation, the bit line driver 30 may be activated by asserting the WE signal and may receive the bit to write into the memory cell 32A-32N that corresponds to the asserted word line WL0 . . . WLN. Specifically, in the illustrated embodiment, the bit line driver may receive the bit as a differential pair D0H/D0L. D0H may be high and D0L may be low if bit Din0 is a binary one, and vice versa if Din0 is a binary zero.

In the illustrated embodiment, the bit line driver 30 may include the transistors $T_2$-$T_5$, which are NMOS transistors in this embodiment. The transistors may form two series connections of transistors between ground and the bit lines BL and BL bar. Specifically, the transistors $T_2$ and $T_4$ may be a series connection to the bit line BL, and the transistors $T_3$ and $T_5$ may be a series connection to the bit line BL bar. The gates of the transistors $T_2$ and $T_3$ are coupled to receive the write enable and the gates of transistors $T_4$ and $T_5$ are coupled to receive D0L and D0H, respectively. Accordingly, if Din0 is a binary one, D0H is high and the transistor $T_5$ is activated. Assertion of the WE activates the transistor $T_3$, and the bit line BL bar is discharged. If Din0 is a binary zero, D0L is low and the transistor $T_4$ is activated. Assertion of the WE activates the transistor $T_2$, and bit line BL is discharged.

The transistors $T_2/T_4$ or $T_3/T_5$ discharging of the bit lines may be resisted by the PMOS in the inverter within the memory cell 32A-32N that is being written, if the cell is storing the opposite state of the bit being written. As mentioned previously, the PMOS transistor may be an MVT transistor and may be supplied by the $V_M$ supply voltage. The D0L and D0H signals may be $V_L$ domain signals, however, in this embodiment. Accordingly, the transistors $T_4$ and $T_5$ may be LVT transistors to improve the writeability of the cells because the "on" current of the transistors $T_4$ and $T_5$ may be higher as LVT transistors than if they were MVT transistors, for a given supply voltage $V_L$. Additionally, using LVT transistors for $T_4$ and $T_5$ and D0L/D0H signals as $V_L$ domain signals may reduce power consumption and area in the integrated circuit 10, in some embodiments, because level shifters may not be needed for the Din signals.

In one embodiment, the transistors $T_2$ and $T_3$ may be MVT transistors, or more generally may have a nominal threshold voltage that is the same as the transistors in the memory cells 32A-32N. Since the transistors $T_2$ and $T_3$ are in series with the transistors $T_4$ and $T_5$, the transistors $T_2$ and $T_3$ may limit the leakage current in the bit line driver circuit 30 to the leakage of the MVT transistors. In this manner, there may not be a leakage current penalty for using LVT transistors for the $T_4$ and $T_5$ transistors. Other embodiments may have the $T_2$ and $T_3$ transistors with the same nominal threshold voltage as the $T_4$ and $T_5$ transistors.

The bit line hold circuit 36 may be provided to hold the precharge on one of the bit lines during a read or write operation responsive to the other bit line falling. For example, if the bit line driver 30 discharges the bit line BL bar, the gate of the PMOS transistor $T_0$ (coupled to bit line BL bar) is low and the transistor $T_0$ is activated to hold the bit line BL high. Similarly, if the bit line driver 30 discharges the bit line BL, the gate of the PMOS transistor $T_1$ is low and the transistor $T_1$ is activated to hold the bit line BL bar high. The bit line hold circuit 36 may provide the hold function during normal operation (non-idle operation). If the bit lines are being floated (e.g. during times that the memory array 24 is idle), the bit line hold circuit 36 may be disabled. For example, in the illustrated embodiment, the transistor $T_{14}$ is provided in series with the transistors $T_0$ and $T_1$, between the transistors $T_0$ and $T_1$ and the $V_M$ supply voltage. If the FloatBL signal is asserted (high), the transistor $T_{14}$ may be deactivated and the bit line hold circuit 36 may be disabled. In another embodiment, the transistor $T_{14}$ may be in series with the transistor $T_0$ and the transistor $T_{15}$ (shown in dotted form in FIG. 4) may be in series with the transistor $T_1$ (and the connection from $T_1$ to $T_{14}$ may not be made).

The transistors $T_0$ and $T_1$ may also aid a "false read" operation that may occur during a write, after the word line has been asserted and before the WE has been asserted. At that point, since the write drivers 30 are not yet driving the bit lines, the selected cell may begin discharging a bit line. The transistors $T_0$ and $T_1$ may resist the discharge of one of the bit lines, effectively latching the false read value. In an embodiment, the transistors $T_0$ and $T_1$ may be MVT transistors, which may reduce leakage current in the memory array 24 while the bit lines are floating. Reducing the leakage current in the PMOS transistors in the memory array 24 may permit the floating bit lines to settle at a lower point (e.g. below ½ $V_M$). Overall leakage may be reduced (e.g. leakage through the passgate NMOS transistors in the memory cells 32A-32N may be reduced as well).

Figure 10:
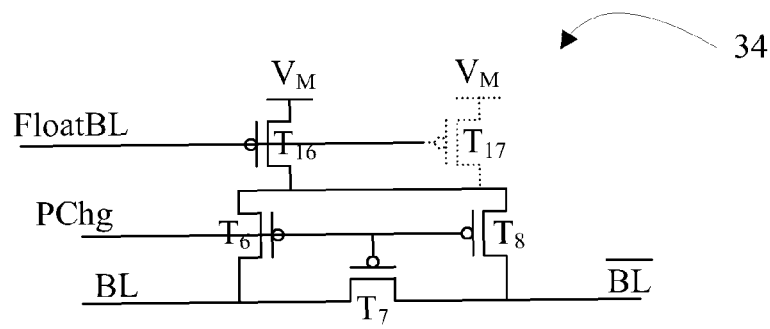
FIG. 10 is a circuit diagram of another embodiment of a bit line precharge circuit shown in FIG. 4.

The bit line precharge circuit 34 may precharge the bit lines responsive to the assertion (low) of the precharge enable (PChg) signal to prepare the bit lines for a read. In the illustrated embodiment, the bit line precharge circuit 34 may include PMOS transistors $T_6$, $T_7$, and $T_8$ having their gates coupled to the precharge signal. The PMOS transistors $T_6$ and $T_8$ may precharge the bit lines BL and BL bar to which the are coupled, as shown in FIG. 4, to the $V_M$ supply voltage to which their sources are coupled. The transistor $T_7$ may provide balancing of the voltage on the bit lines. In other embodiments, two bit line precharge circuits may be used. One bit line precharge circuit may be used if the previous operation was a read, since the bit lines are not fully discharged in a read operation. Both precharge circuits may be used if the previous operation was a write, to precharge the bit line that was fully (or almost fully) discharged to a voltage near ground. As noted previously, the PChg signal may be driven high by the level shifter 29a in response to the FloatBL signal being asserted during idle times of the memory array 24. Thus, the precharge circuit may be disable during idle times. In another embodiment, one or more PMOS transistors may be coupled between the transistors $T_6$ and $T_8$ and the $V_M$ supply voltage (e.g. similar to the transistors $T_{14}$ and $T_{15}$). The PMOS transistors may have their gates coupled to receive the FloatBL signal (again similar to transistors $T_{14}$ and $T_{15}$), and the bit line precharge circuit 34 may be disabled when the FloatBL signal is asserted. An example of the bit line precharge circuit 34 configured in this fashion is shown in FIG. 10, where transistors $T_{16}$ and optionally $T_{17}$ are coupled between the transistors $T_6$ and $T_8$ and the $V_M$ supply voltage, and are coupled to receive the FloatBL signal on their gates.

In one embodiment, the transistors $T_6$, $T_7$, and $T_8$ may be MVT transistors, again reducing the leakage current. In an embodiment, the disabling of the bit line precharge circuit 34 during idle times may reduce the NBTI effects and/or other aging effects in the transistors over time. Thus, the margin typically designed into these transistors to compensate for NBTI may be eliminated, and smaller (e.g. in channel width) transistors may be used. Power consumption and area may be reduced in the integrated circuit 10.

In the illustrated embodiment, the bit lines BL and BL bar are column selected by the column select circuit 42. Accordingly, the second precharge circuit 40 may precharge the bit lines at the output of the column select circuit 40 (coupled to the senseamp 38). The second bit line precharge circuit includes transistors $T_{11}$, $T_{12}$, and $T_{13}$ similar to transistors $T_6$, $T_7$, and $T_8$ respectively, and may be MVT transistors in one embodiment. In another embodiment, similar to the discussion above with regard to the bit line precharge circuit 34, one or more PMOS transistors may be coupled between the transistors $T_{11}$ and $T_{13}$ and the $V_M$ supply voltage (e.g. similar to the transistors $T_{14}$ and $T_{15}$). The PMOS transistors may have their gates coupled to receive the FloatBL signal (again similar to transistors $T_{14}$ and $T_{15}$), and the second bit line precharge circuit 40 may be disabled when the FloatBL signal is asserted.

The column select circuit 42 may permit multiple columns of memory cells 32A-32N to share the same senseamp circuit 38. The columns that share the senseamp circuit 38 are not concurrently read, and the column that is being read may be selected via assertion of the CSel signal (low) to the column select circuit 42 in that column. That is, there may be a different CSel signal for each sharing column. In one embodiment, the column select circuit 42 includes the transistors $T_9$ and $T_{10}$, coupled between the bit lines BL and BL bar, respectively, and the inputs to the senseamp 38. The gates of the transistors $T_9$ and $T_{10}$ are coupled to receive the CSel signal. Thus, an assertion (low) of the CSel signal activates the transistors $T_9$ and $T_{10}$ and couples BL and BL bar to the inputs of the senseamp 38. It is noted that, while PMOS transistors are shown for the transistors $T_9$ and $T_{10}$, other embodiments may use NMOS transistors and the CSel signal may be asserted high. In one embodiment, the transistors $T_9$ and $T_{10}$ may be LVT transistors. In other embodiments, the transistors $T_9$ and $T_{10}$ may be MVT, or any other transistor type.

It is noted that column selection is optional. Memory arrays that do not implement column selection may eliminate the column select circuit 42 and the second bit line precharge circuit 40.

The senseamp 38 may include any sense amplifier circuit that is coupled to receive a pair of bit lines and sense a differential between the pair to drive an output bit. In other embodiments, the senseamp 38 may output a differential pair of bits with full signal swing, amplified from the sensed differential on the bit lines. For example, a differential of about 100 millivolts on the bit lines may be sufficient for the senseamp 38 to detect the difference. The senseamp 38 in the illustrated embodiment is controlled by the RE signal. In the illustrated embodiment, the senseamp 38 is supplied with the $V_M$ supply voltage. Level shifters may be provided at the output of the senseamp 38 to level shift the signals to the $V_L$ domain. In other embodiments, the senseamp 38 may be supplied with the $V_L$ supply voltage.

Figure 11:
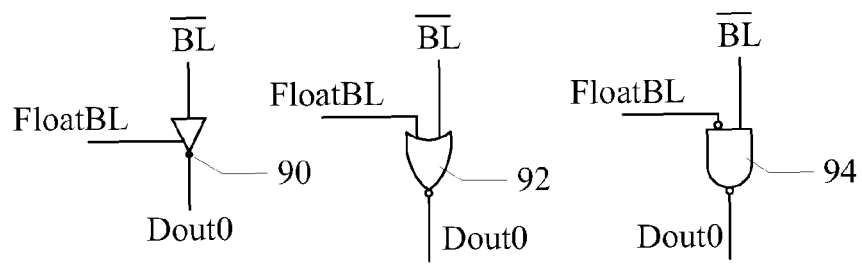
FIG. 11 is a circuit diagram illustrating various embodiments of alternate output circuits for the memory array.

The senseamp 38 may be a double ended output of the memory array 24, but other embodiments may implement a single ended output. For example, an inverter with a high skew may be coupled to the BL bar line, and may output the bit Dout0. That is, the inverter may be skewed so that the switch point of the inverter is near $V_M$, rather than closer to the midpoint between $V_M$ and ground. In such an embodiment, the inverter may be a tristate inverter controlled by the FloatBL signal. An example of such an embodiment is illustrated in FIG. 11, reference numeral 90. Alternatively, a NAND or NOR gate with a highly skewed input for the bit line and another input for the FloatBL signal may be used, and the FloatBL signal may cause a defined output bit during the idle times. See examples in FIG. 11, reference numerals 92 and 94. AND or OR gates could be used as well. Generally, any logic gate that may be controlled by an asserted FloatBL signal and may output the bit from the memory cell if the FloatBL is deasserted may be used. In non-idle times, the FloatBL signal may be deasserted and the bit line may control the output.

While specific examples of the bit line drivers 30, the bit line precharge circuits 34 and 40, the bit line hold circuit 36, and the column select circuit 42, are illustrated in FIG. 4, any designs for these circuits may be used in other embodiments.

While the memory cells 32A-32N are described as CMOS SRAM cells, other memory cells may be used in other embodiments. Generally, a memory cell may include circuitry configured to store a bit and configured to permit reading and writing of the bit.

After the memory array 24 (and other memory arrays in the integrated circuit 10) have been idle and the bit lines have been floated and settled to a steady state based on the leakage in the memory arrays, the power control circuit 16 may detect that the logic circuits are to be powered back up. The $V_L$OFF and FloatBL signals may be deasserted as part of the power up process, and the bit line precharge circuits may be enabled again to precharge the bit lines for normal operation. During normal operation, only a small subset of the total bit lines in a memory array may be precharged at the same time. However, when the bit lines have been floated, each set of bit lines may be precharged. The current consumed by the bit line precharge circuits to precharge the bit lines may cause a significant local disruption in the supply voltage grid, causing larger than expected voltage droops and other potential problems. In one embodiment, the memory circuits 14 may be configured to stagger the precharge of the bit lines to reduce the magnitude of the current due to the precharge after bit line floating.

Figure 5:
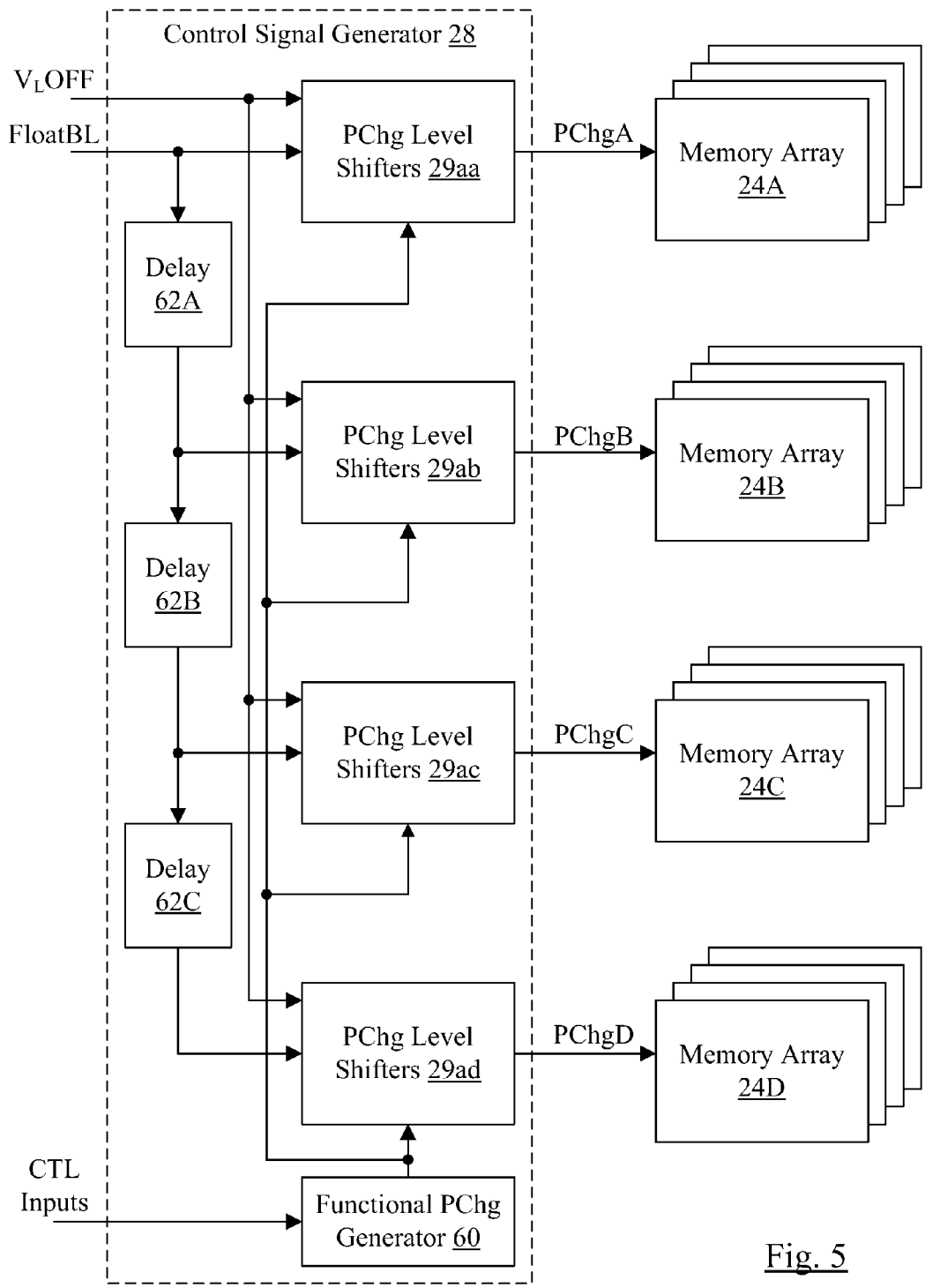
FIG. 5 is a block diagram of one embodiment of a control signal generator shown in FIG. 2.

The memory circuits 14 may implement any desired circuitry for staggering the precharge. In one embodiment, for example, a state machine may be used to precharge subsets of the bit lines at each state in the state machine. Other embodiments may use a delay chain to delay the re-enable of the bit line precharge circuits. FIG. 5 is an example of one embodiment implementing a delay chain.

In the embodiment of FIG. 5, the FloatBL signal may be delayed through the delay chain. By delaying the FloatBL signal, the functional precharge enable signal generated to precharge bit lines that have been discharged for a read or write operation may not be affected, for example. Other embodiments may delay the $V_L$OFF signal instead, if desired.

The bit lines of the memory array 24 may be divided into groups, and each group of bit lines maybe enabled at a different point in time. The groups may be formed in any desired fashion. For example, in an embodiment, the memory array 24 may be arranged into a set of banks, where one bank is typically read or written in response to a given access to the memory array 24. The groups may be each be one or more banks For example, in FIG. 5, the memory array may be grouped into groups of four banks each. Four groups of banks (24A, 24B, 24C, and 24D) are shown in FIG. 5, and thus the memory array 24 may have 16 banks in this example. Other embodiments may implement more or fewer banks, and more or fewer banks per group, as desired.

The precharge level shifters 29a that correspond to each group of banks are shown in FIG. 5 as precharge level shifters 29aa, 29ab, 29ac, and 29ad in the control signal generator circuit 28. There may be more than one precharge level shifter for each group. For example, there may be one precharge level shifter for each bank, since banks may be individually precharged for normal read/write operations. There may be more than one precharge level shifter per bank (e.g. if electrical/timing considerations make multiple precharge enable signals per bank desirable). One precharge enable may be shared by two or more banks, in another embodiment, and there may be an equivalent number of level shifters per bank. The precharge enable signal(s) for each group are illustrated in FIG. 5 from the precharge level shifters 29aa-29ad to the memory arrays 24A-24D as PChgA, PChgB, PChgC, and PChgD.

The precharge level shifters 29aa-29ad are coupled to receive the $V_L$OFF signal, and are coupled to receive the respective functional precharge enable signals from the functional PChg generator circuit 60. The functional PChg generator circuit 60 may generate separate functional precharge enable signals for each bank, for example. The functional PChg generator circuit 60 may generate the functional precharge enable signals based on various control inputs to the control signal generator 28. For example, the control inputs may indicate that a read or write to a particular bank is being performed, and the functional PChg generator circuit 60 may generate the functional precharge enable signal to precharge the bit lines after the read/write completes. In various embodiments, the functional precharge enable may be generated in different fashions (e.g. self-timed, in the clock phase following the read/write, etc.). The functional precharge enable signals maybe be coupled to the "In" inputs of the level shifters 29aa-29ad. The PChgA, B, C, and D signals may be the "Out" outputs of the level shifters 29aa-29ad, and the $V_L$OFF signal and FloatBL signal (or delayed FloatBL signal) may be coupled to the like-named inputs of the level shifters 29aa-29ad.

The FloatBL signal is input into one set of level shifters 29aa as well as a delay circuit 62A. The delay circuit 62A is configured to produce a first delayed FloatBL signal to the level shifters 29ab and to the delay circuit 62B, which is configured to produce a second delayed FloatBL signal to the level shifters 29ac and to the delay circuit 62C, which in turn is configured to produce a third delayed FloatBL signal to the level shifters 29ad.

Figure 6:
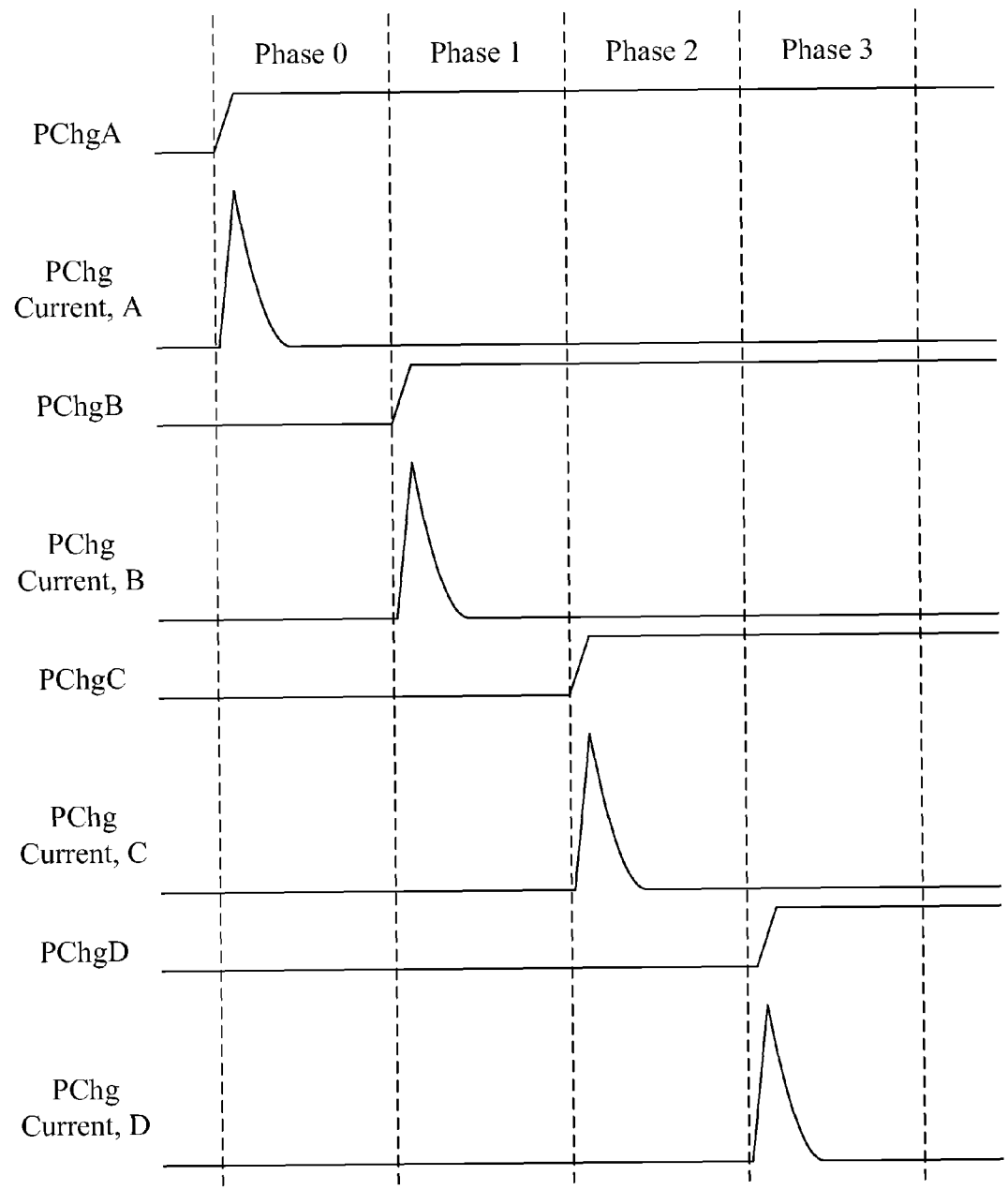
FIG. 6 is a timing diagram illustrating one embodiment of precharge staggering.
Figure 7:
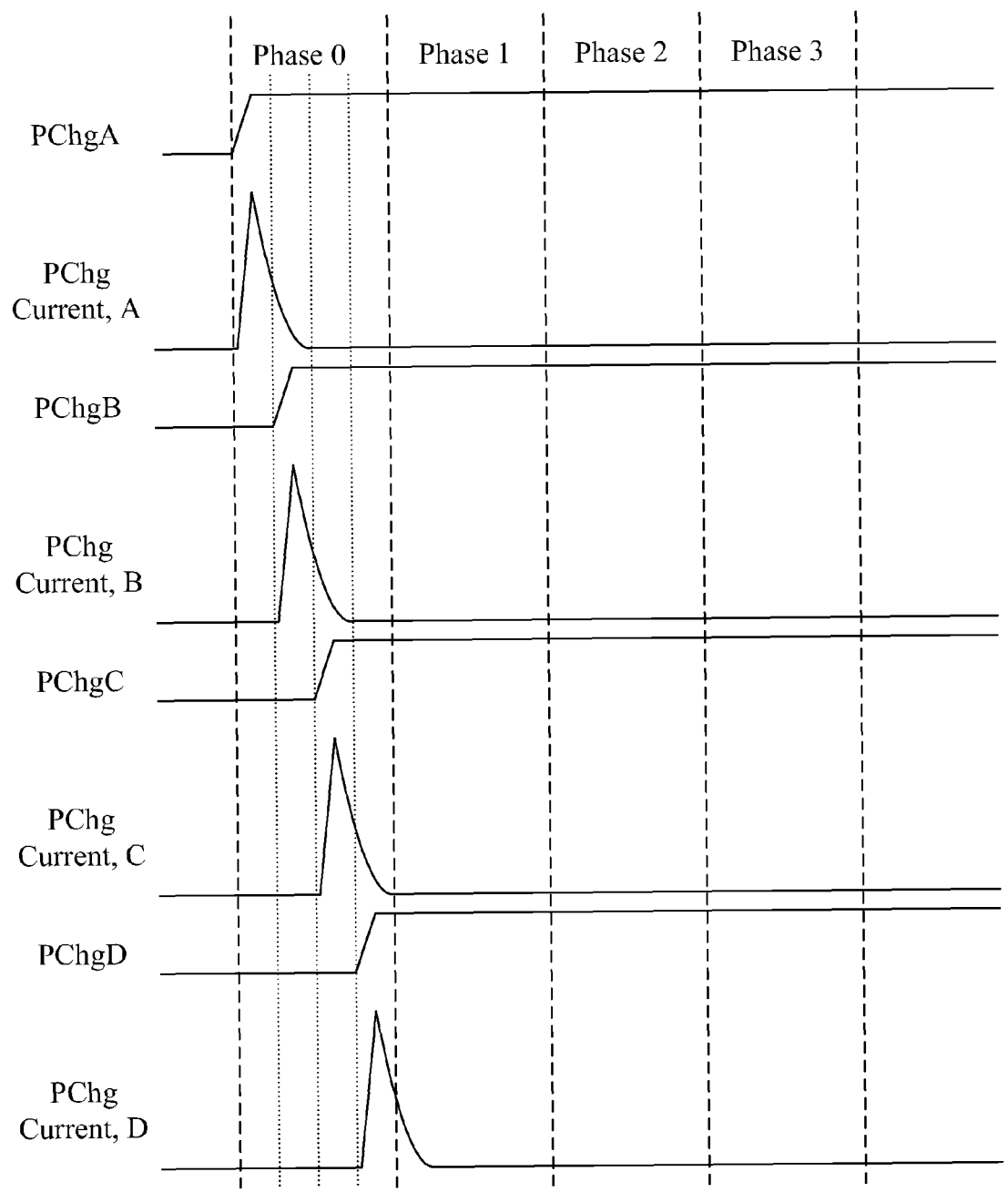
FIG. 7 is a timing diagram illustrating another embodiment of precharge staggering.

The amount of delay provided by each delay circuit 62A-62C may vary from embodiment to embodiment. For example, in an embodiment, the precharge enable may be asserted for one clock phase to precharge the bit lines. Each delay circuit 62A-62C may provide approximately a clock phase of delay. FIG. 6 is a timing diagram illustrating such an embodiment for four groups of precharge enables PChgA, B, C, and D. The precharge current for groups A, B, C, and D is also illustrated. As can be seen, the precharge current may be high early in the phase, and may gradually reduce as the phase continues and the bit lines return to full precharge state. Accordingly, other embodiments may generate less than a phase of delay. For example, FIG. 7 is a timing diagram illustrating an example in which each delay is approximately one quarter of a clock phase. Other embodiments may employ any fraction or multiple of a clock phase of delay. Generally, the difference in points in time at which precharge of groups of bit lines may be initiated via assertion of the corresponding precharge enable signal(s) may be derived from an amount of time that elapses for a precharge in the memory array.

It is noted that, while some embodiments may assert the precharge enable for one phase to perform a precharge, FIGS. 6 and 7 illustrate the precharge enables remaining asserted for more than one phase. In this example, the precharge enables may remain asserted until the integrated circuit 10 (logic circuits 12) has returned to fully functional status and may be begin memory circuit read/write operations again.

The delay circuits 62A-62C may implement any desired circuits for generating the delay. For example, an even numbered series of inverters may be used, where the total delay through the inverters is expected to be approximately the desired delay.

Other embodiments may group bit lines for precharge enabling in other fashions than banks. For example, bit lines that are column selected together may be grouped, or bit lines that are physically located near each other in the array may be grouped.

Figure 8:
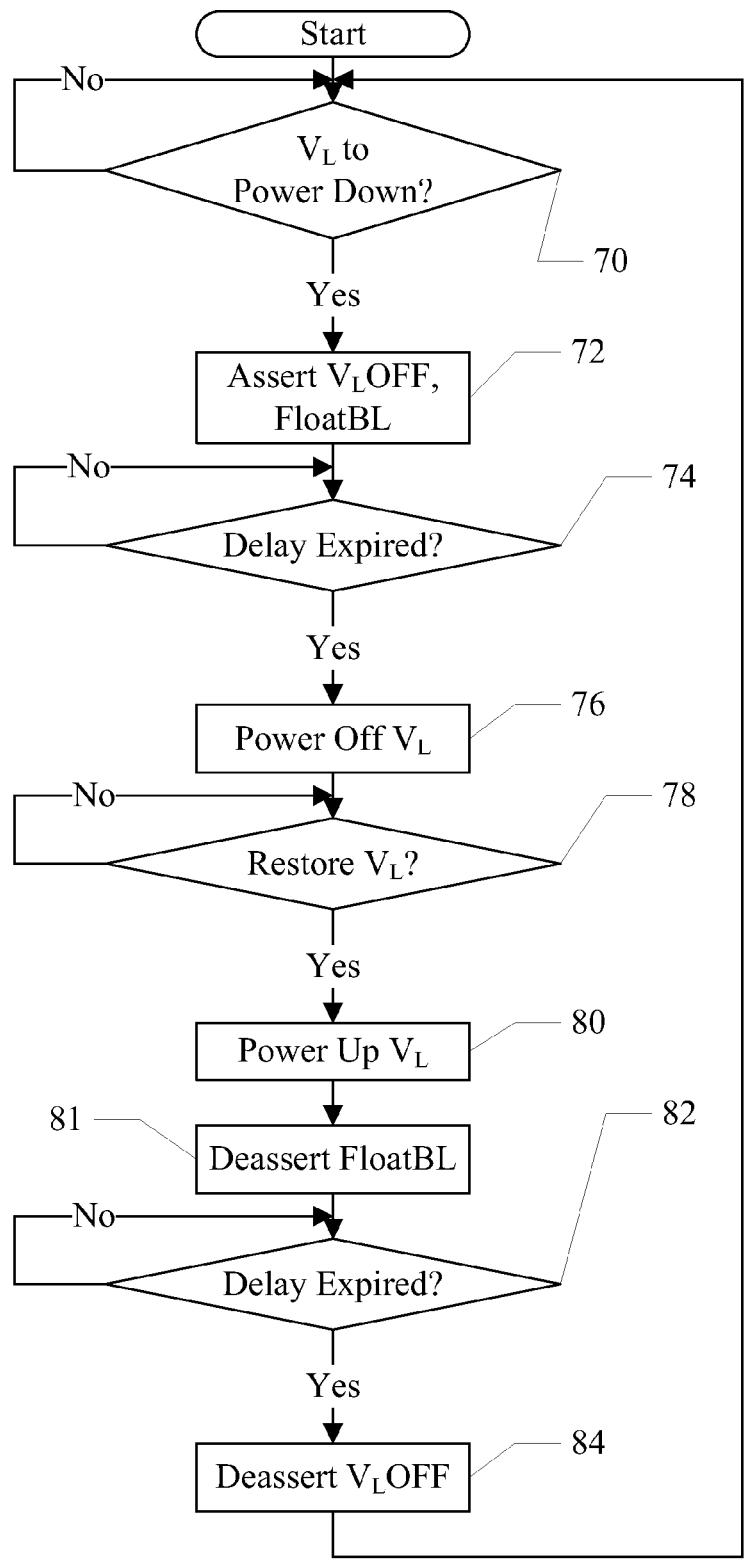
FIG. 8 is a flowchart illustrating operation of one embodiment of the integrated circuit shown in FIG. 1

Turning now to FIG. 8, a flowchart is shown illustrating one embodiment of a method for using the $V_L$OFF signal, the FloatBL signal, and level shifters 29 as described above to protect receiving circuitry such as the memory circuits when source circuitry has its supply voltage powered down and/or powered up. For example, the method may be implemented by the power control circuit 16 (in conjunction with an external voltage regulator to power the supply voltage up or down, in one embodiment). That is, the power control circuit 16 may be configured to implement the operation illustrated in FIG. 8. While the blocks are shown in a particular order for ease of understanding, other orders may be used. Blocks may be performed in parallel by combinatorial logic in the power control circuit 16. Blocks, combinations of blocks, and/or the flowchart as a whole may be pipelined over multiple clock cycles.

The power control circuit 16 may monitor various signals and determine if the $V_L$ supply voltage is to be powered down (decision block 70). If so (decision block 70, "yes" leg), the power control circuit 16 may assert the $V_L$OFF signal and the FloatBL signal (block 72). In some embodiments, the FloatBL assertion may occur after the $V_L$OFF signal (e.g. to permit the wordline disabling and other memory array isolation steps to occur before floating the bit lines). Optionally, the power control circuit 16 may delay for a period of time to allow the $V_L$OFF signal and the FloatBL signal to propagate and the level shifters to establish their predetermined voltage levels. Once the delay has expired (decision block 74, "yes" leg), the power control circuit 16 may cause the $V_L$ supply voltage to be powered off (block 76). For example, the power control circuit 16 may transmit a request to a voltage regulator or other power circuit that supplies the $V_L$ supply voltage. The $V_L$OFF signal and the FloatBL signal may remain asserted.

At some point, it may be desirable to power the $V_L$ supply voltage back up (or restore the voltage—decision block 78). Similar operation may occur at initial power up of the $V_L$ supply voltage (e.g. when a device containing the integrated circuit 10 is powered on). When the $V_L$ supply voltage is to be restored (decision block 78, "yes" leg), the power control circuit 16 may cause the $V_L$ supply voltage to be powered up (block 80). For example, the power control circuit 16 may transmit a request to the voltage regulator or other power circuit that supplies the $V_L$ supply voltage, as mentioned above. The power control circuit 16 may also deassert the FloatBL signal, causing the bit lines in the memory arrays to precharge (block 81). As mentioned previously, the precharge may be staggered across the bit lines. Optionally, the power control circuit 16 may delay for a time period to allow the $V_L$ supply voltage to power up and stabilize, and for the circuitry powered by the $V_L$ supply voltage to initialize. When the delay expires (decision block 82, "yes" leg), the power control circuit may deassert the $V_L$OFF signal (block 84), and the level shifters may begin regular operation.

Figure 9:
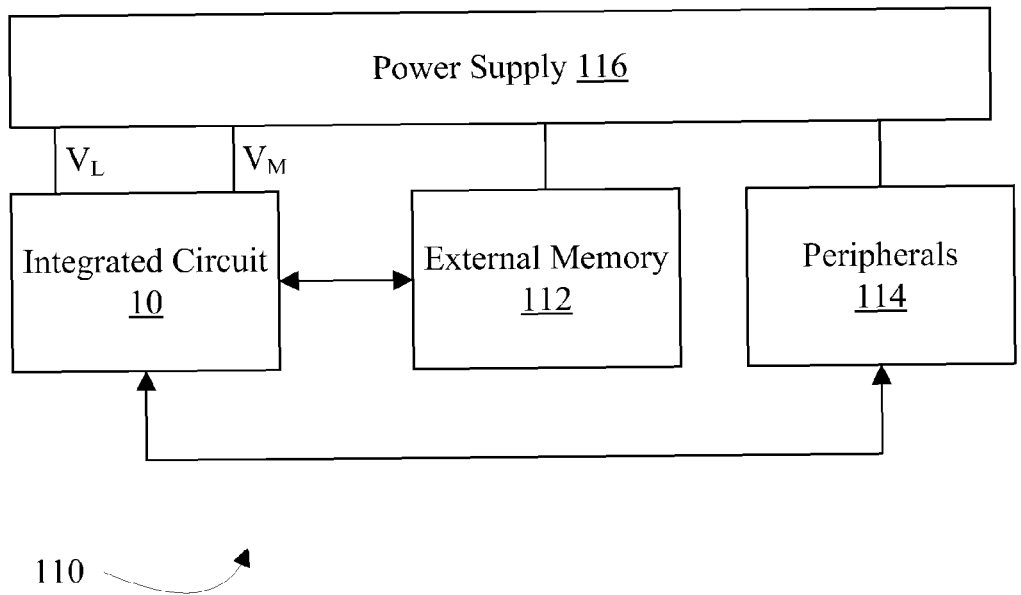
FIG. 9 is a block diagram of one embodiment of a system.

Turning next to FIG. 9, a block diagram of one embodiment of a system 110 is shown. In the illustrated embodiment, the system 110 includes at least one instance of the integrated circuit 10 coupled to one or more peripherals 114 and an external memory 112. A power supply 116 is also provided which supplies the $V_L$ and $V_M$ supply voltages to the integrated circuit 10 as well as one or more supply voltages to the memory 112 and/or the peripherals 114. In some embodiments, more than one instance of the integrated circuit 10 may be included.

The external memory 112 may be any desired memory. For example, the memory may comprise dynamic random access memory (DRAM), static RAM (SRAM), flash memory, or combinations thereof. The DRAM may comprise synchronous DRAM (SDRAM), double data rate (DDR) SDRAM, DDR2 SDRAM, DDR3 SDRAM, etc.

The peripherals 114 may include any desired circuitry, depending on the type of system 110. For example, in one embodiment, the system 110 may be a mobile device and the peripherals 114 may include devices for various types of wireless communication, such as wifi, Bluetooth, cellular, global position system, etc. The peripherals 114 may also include additional storage, including RAM storage, solid state storage, or disk storage. The peripherals 114 may include user interface devices such as a display screen, including touch display screens or multitouch display screens, keyboard or other keys, microphones, speakers, etc.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
a control circuit configured to generate a first control signal to a memory circuit in the integrated circuit; and
the memory circuit coupled to receive the first control signal, the memory circuit having a plurality of bit lines used to input data to the memory circuit and output data from the memory circuit, wherein the memory circuit is configured to float the plurality of bit lines responsive to an assertion of the first control signal received by the memory circuit, and wherein the memory circuit comprises a plurality of precharge circuits coupled to the plurality of bit lines and configured to precharge the plurality of bit lines, and wherein the memory circuit is configured to precharge the plurality of bit lines responsive to a deassertion of the first control signal, and wherein the memory circuit is configured to stagger an activation of the plurality of precharge circuits responsive to a deassertion of the first control signal.

2. The integrated circuit as recited in claim 1 wherein the plurality of precharge circuits are grouped into a plurality of groups, and wherein memory circuit is configured to stagger the activation of the plurality of precharge circuits by activating each group at a different point in time.

3. The integrated circuit as recited in claim 2 wherein the precharge circuits that are in a first group of the plurality of groups are the precharge circuits included in one or more banks of memory in the memory circuit.

4. The integrated circuit as recited in claim 2 wherein a difference between the points in time is approximately equal to one phase of a clock signal that clocks the memory circuit.

5. The integrated circuit as recited in claim 2 wherein a difference between the points in time is a portion on one phase of a clock signal that clocks the memory circuit.

6. The integrated circuit as recited in claim 2 wherein a difference between the points in time is derived from an amount of time in which a precharge is performed by the precharge circuits.

7. The integrated circuit as recited in claim 1 wherein the memory circuit comprises a delay circuit coupled to receive the first control signal and configured to output a delayed control signal, wherein the memory circuit is configured to activate a first subset of the plurality of precharge circuits directly in response to the control signal, and wherein the memory circuit is configured to activate a second subset of the plurality of precharge circuits responsive to the delayed control signal.

8. The integrated circuit as recited in claim 7 wherein the memory circuit comprises a second delay circuit coupled to receive the delayed control signal and configured to output a second delayed control signal responsive to the delayed control signal, wherein the memory circuit is configured to activate a third subset of the plurality of precharge circuits responsive to the second delayed control signal.

9. A method comprising:
determining that a logic circuit that interfaces to a memory is to be powered down while the memory remains powered up;
floating bit lines in the memory responsive to the determining, the floating including disabling precharge circuits on the bit lines through one or more level shifters that generate the precharge enable signal to the precharge circuits;
determining that the logic circuit is to be powered back up; and
enabling the precharge circuits responsive to determining that the logic circuit is to be powered back up, wherein enabling the precharge circuits comprises staggering the enable of the precharge circuits to two or more points in time.

10. The method as recited in claim 9 wherein a difference between a first point in time of the two or more points in time and a second point in time of the two or more points in time is approximately one phase of a clock equal to one phase of a clock signal that clocks the memory.

11. The method as recited in claim 9 wherein a difference between a first point in time of the two or more points in time and a second point in time of the two or more points in time is a portion on one phase of a clock signal that clocks the memory circuit.

12. The method as recited in claim 11 wherein the portion is derived from an amount of time in which a precharge is performed by the precharge circuits.

13. The method as recited in claim 9 wherein floating the bit lines further comprises disabling bit line hold circuits on the bit lines.

14. A memory circuit comprising:
- a control signal input coupled to receive a first control signal;
- a plurality of bit lines used to input data to the memory circuit and output data from the memory circuit;
- circuitry configured to float the plurality of bit lines responsive to an assertion of the first control signal;
- a plurality of precharge circuits coupled to the plurality of bit lines and configured to precharge the plurality of bit lines; and
- a control signal generator configured to cause the plurality of precharge circuits to precharge the plurality of bit lines responsive to a deassertion of the first control signal, and wherein the control signal generator is configured to stagger an activation of the plurality of precharge circuits responsive to a deassertion of the first control signal.

15. The memory circuit as recited in claim 14 wherein the plurality of precharge circuits are grouped into a plurality of groups, and wherein memory circuit is configured to stagger the activation of the plurality of precharge circuits by activating each group at a different point in time.

16. The memory circuit as recited in claim 15 wherein the precharge circuits that are in a first group of the plurality of groups are the precharge circuits included in one or more banks of memory in the memory circuit.

17. The memory circuit as recited in claim 15 wherein a difference between the points in time is approximately equal to one phase of a clock signal that clocks the memory circuit.

18. The memory circuit as recited in claim 15 wherein a difference between the points in time is a portion on one phase of a clock signal that clocks the memory circuit.

19. The memory circuit as recited in claim 15 wherein a difference between the points in time is derived from an amount of time in which a precharge is performed by the precharge circuits.

* * * * *